United States Patent [19]

Hasegawa

[11] Patent Number: 4,755,445

[45] Date of Patent: Jul. 5, 1988

[54] DRY PRESENSITIZED PLATE FOR USE IN MAKING A LITHOGRAPHIC PRINTING PLATE

[75] Inventor: Akira Hasegawa, Shizuoka, Japan

[73] Assignee: Fuji Photo Film Co., Ltd., Minami-ashigara, Japan

[21] Appl. No.: 12,348

[22] Filed: Feb. 9, 1987

[30] Foreign Application Priority Data

Feb. 13, 1986 [JP] Japan .................................. 61-29727

[51] Int. Cl.⁴ ........................... G03C 1/68; G03C 1/72
[52] U.S. Cl. ..................................... 430/138; 430/272; 430/303; 101/453; 101/467
[58] Field of Search ................. 430/138, 272, 303; 101/453, 467

[56] References Cited

U.S. PATENT DOCUMENTS

| | | | |
|---|---|---|---|
| 3,677,178 | 7/1972 | Gipe | 430/272 X |
| 3,953,212 | 4/1976 | Miyano et al. | 430/303 X |
| 4,016,814 | 3/1977 | Schank et al. | 430/303 X |
| 4,086,386 | 4/1978 | Gaworowski et al. | 428/321.5 |
| 4,292,397 | 9/1981 | Takeuchi et al. | 430/303 |
| 4,399,209 | 8/1983 | Sanders et al. | 430/138 |
| 4,636,453 | 1/1987 | Keys et al. | 430/138 |

FOREIGN PATENT DOCUMENTS

| | | | |
|---|---|---|---|
| 1148362 | 4/1969 | United Kingdom . | |
| 1399949 | 4/1975 | United Kingdom | 430/303 |
| 1419643 | 12/1975 | United Kingdom | 430/303 |

*Primary Examiner*—Paul R. Michl
*Assistant Examiner*—Cynthia Hamilton
*Attorney, Agent, or Firm*—Burns, Doane, Swecker & Mathis

[57] ABSTRACT

A dry presensitized plate for use in making a lithographic printing plate requiring no dampening water during printing, which comprises a support having provided thereon, in order, a light-sensitive layer of microcapsules comprising a photohardenable monomer or a light-sensitive resin and a silicone rubber layer. The dry presensitized plate makes it possible to obtain a dry lithographic printing plate without using any developers and the removal of the silicone rubber layer. Therefore, the development of the dry presensitized plate is simple and economical.

17 Claims, No Drawings

DRY PRESENSITIZED PLATE FOR USE IN MAKING A LITHOGRAPHIC PRINTING PLATE

BACKGROUND OF THE INVENTION

1. Field of the Invention

The present invention relates to a dry presensitized plate and more particularly to a dry presensitized plate for use in making a lithographic printing plate requiring no dampening water during printing.

2. Description of the Prior Art

There have been proposed a various kind of dry presensitized plates (hereunder referred to as dry PS plate(s) for simplicity) for use in making lithographic printing plates requiring no dampening water during printing, which comprises a support having provided thereon, in order, a light-sensitive layer and a silicone rubber layer. In this respect, reference is made to, for example, Japanese Patent Publn. Nos. 44-23042; 46-16044; 51-17081; 54-26923 and 55-22781 and Japanese Patent Application (unexamined and opened to public inspection, hereinafter referred to as "OPI") No. 56-80046. Methods for making printing plates from the aforementioned dry PS plate are roughly divided into the following two groups; one of which comprises removing a silicone rubber layer in image areas (ie., exposed or nonexposed areas depending on the kind of the PS plate) by dissolving the underlying light-sensitive layer in the image areas with a developer to form images (eg. printing areas), see, for instance, Japanese Patent Publn. No. 46-16044; the other of which comprises depositing or applying a photoadhesive light-sensitive layer (in the case of positive-working PS plate) or a photoreleasable light-sensitive layer (in the case of negative-working PS plate) and selectively removing silicone rubber layer only in the areas causing no photoadhesion or those causing photorelease upon imagewise exposure by swelling (so-called method for selectively swelling and removing only the silicone rubber layer on the light-sensitive layer), see, for instance, Japanese Patent Publn. No. 54-26923 and Japanese Patent Appln. (OPI) No. 56-80046.

In any event, it is necessary to remove the silicone rubber layer with a developer in these methods. This makes the plate making process more complicated and further gives rise to a variety of problems of hygiene, public pollution and safety, depending on agents used for development. Therefore, such methods for making printing plate including a procedure for removing a silicone rubber layer with a developer are not preferred.

On the contrary, a dry PS plate which permits the plate making without using a liquid developer is disclosed in Japanese Patent Publn. No. 56-41105 and U.S. Pat. No. 4,271,255. These dry PS plates are provided with a cover sheet on the silicone rubber layer directly or through an adhesive layer. This cover sheet serves to enhance the adhesive force between the cover sheet and the silicone rubber layer upon exposure to light to an extent that the adhesive force therebetween is superior to that between the silicone rubber layer and the underlying layer thereof and thus the silicone rubber layer in exposed areas is simultaneously removed when the cover sheet is removed. However, this kind of dry PS plate suffers a variety of disadvantages such that the quality of images is lowered because of such removing treatment, that it takes much time and requires much labor to treat the removed cover sheet and so forth.

SUMMARY OF THE INVENTION

The inventors of this invention have conducted studies for overcoming the foregoing disadvantages accompanied by the conventional dry PS plates. As a result, the inventors have found that these disadvantages can effectively be eliminated by utilizing a specific light-sensitive composition for forming a light-sensitive layer and completed the present invention.

Accordingly, the principal object of this invention is to provide a dry PS plate which makes it possible to easily form image areas and nonimage areas according to a dry treatment.

The aforementioned and other objects of the present invention can effectively be accomplished by providing a dry PS plate which comprises a support having provided thereon, in order, a light-sensitive layer of microcapsules comprising a photopolymerizable monomer or a light-sensitive resin and a silicone rubber layer.

DETAILED EXPLANATION OF THE INVENTION

The dry PS plate according to the present invention is very stable under usual conditions and during a common handling, while, upon imagewise exposure, it causes hardening in exposed areas owing to polymerization of a polymerizable monomer or a light-sensitive resin included in microcapsules for obtaining a light-sensitive layer. In this respect, the microcapsules never collapses and releases the content thereof after once it is hardened. On the other hand, the microcapsule in nonexposed areas (ie., nonhardened areas) collapses and releases the content thereof such as the polymerizable monomer or light-sensitive resin as well as other additives when heat and/or pressure are applied thereto and thus the content is penetrated into the overlying silicone rubber layer to make the nonexposed areas ink receptive and to form image areas.

In other words, the dry PS plate according to the present invention is positive-working type one in which, upon applying heat and/or pressure after imagewise exposure, the exposed areas are converted to nonimage areas, while the nonexposed areas are converted to image areas. The dry PS plate after exposure to light may be treated according to the following treatment selected from the group consisting of heating, pressing and the combination thereof depending on materials of microcapsules, particle size thereof, thickness of the wall thereof and the like. When heating is selected as such treatment, a particularly excellent result can be obtained by using polyurea, polyurethane, polyester or a mixture thereof as the material for wall of the microcapsule. While, if pressing is selected as such treatment, a very good result is obtained by utilizing the microcapsule having a particle size of at least $0.5\mu$.

The photopolymerizable monomers to be incorporated or encapsulated into the microcapsules as used in the present invention are compounds having at least one, preferably a plurality of vinyl or vinylidene groups and include compounds such as those having acryloyl groups, methacryloyl groups, allyl groups, unsaturated polyester groups, vinyloxy groups, acrylamide groups or the like. The most typical examples thereof include, for instance, reaction products of polymers such as polyol, polyamine or aminoalcohol with an unsaturated carboxylic acid; reaction products of an acrylate or a methacrylate having hydroxyl groups with a polyisocyanate.

For example, such compounds typically include polyethylene glycol diacrylate, propylene glycol dimethacrylate, pentaerythritol triacrylate, trimethylolpropane diacrylate, trimethylolpropane triacrylate, pentaerythritol tetraacrylate, hexanediol diacrylate, 1,2-butanediol diacrylate, tetrakis β-acryloxyethyl ethylenediamine, a reaction product of an epoxy resin and acrylic acid, a reaction product of methacrylic acid, pentaerythritol and acrylic acid, a mixture of maleic acid, diethylene glycol and acrylic acid, methyl methacrylate, butyl methacrylate, styrene, divinylbenzene and diarylnaphthalene. The photopolymerizable monomers as used herein may also be selected from those disclosed in, for example, Japanese Patent Appln. (OPI) Nos. 49-52889, 48-68641 and 48-32586 and Japanese Patent Publn. No. 49-7115. These monomers may be used alone or in combination of two or more of the aforementioned monomers.

In general, these monomers absorb light at 300 nm or less in the ultraviolet region. Therefore, it is desirable to simultaneously use a light-sensitive material, in order to impart light sensitivity to the light in the ultraviolet to visible region to a light-sensitive layer, which absorbs light in such region and causes polymerization of monomers. Examples of the light-sensitive material include compounds which are generally known as photopolymerization initiators and already disclosed in detail in, for instance, Kosar, "Light Sensitive Systems", John Wiley & Sons; Warashina et al., "Light-sensitive Resins" issued by Nikkan Kogyo Shinbunsha (newspaper publishing company); Kakuta et al., "Light-sensitive Resins", the Print Society.

The photopolymerization initiators are, for example, aromatic ketone, quinone compounds, ether compounds and nitro compounds. Examples thereof include benzoquinone, phenanthrenequinone, naphthoquinone, diisopropyl phenanthrenequinone, benzoisobutyl ether, benzoin, furoinbutyl ether, Michler's ketone, Michler's thioketone, tetraphenyl furoin dimer, fluorenone, trinitrofluorene, β-benzoylaminonaphthalene. These initiators are used in an amount of 0.1 to 30% by weight based on the weight of vinyl compounds in the present invention.

Moreover, a polymer as disclosed in Japanese Patent Appln. No. 60-151864 and Japanese Patent Publn. Nos. 46-32714 and 49-34041 may be encapsulated in the microcapsule in order to make the hardening by photopolymerization more effective.

According to the present invention, the foregoing photopolymerizable monomer, photopolymerization initiator, light-sensitive resin or the like are then encapsulated into microcapsules. At this stage, a solvent may simultaneously be used, which may be a natural or synthetic oil which can be used alone or in combination. Examples of such solvents include cottonseed oil, kerosine, aliphatic ketone, aliphatic ester, paraffin, naphthene oil, alkylated biphenyl, alkylated terphenyl, chlorinated paraffin, alkylated naphthalene, and a diaryl ethane such as 1-phenyl-1-xylylethane, 1-phenyl-1-p-ethylphenyl ethane, 1,1'-ditolylethane.

The light-sensitive resins as used herein are, for instance, a cinnamate of polyvinyl alcohol; a light-sensitive resin comprising an azide compound and a cyclized rubber, or a styrene-butadiene copolymer; a diazo light-sensitive resin; a light-sensitive resin comprised of polyvinyl acetophenone and benzaldehyde.

In addition to the aforementioned compounds, the microcapsule according to the present invention may include a thermal polymerization inhibitor. Useful examples thereof include hydroquinone, p-methoxyphenol, di-tert-butyl-p-cresol, pyrogallol, tert-buthyl catechol, benzoquinone, 4,4'-thiobis(3-methyl-6-tert-buthylphenol), 2,2'-methylene-bis(4-methyl-6-tert-butylphenol), and 2-mercaptobenzimidazole. Moreover, the microcapsule may contain a dye or a pigment for the purposes of coloring the resulting light-sensitive layer and further a pH indicator as the printing-out agent and a dye as disclosed in Japanese Patent Appln. (OPI) No. 60-120354.

For the purpose of the coloration of image areas, it may also be effective to encapsulate, into the microcapsule, either a coloring agent or a combination of a coloring agent and a color precursor which permits the formation of a colored material when it comes into contact with the coloring agent. The term "coloring agent" herein means a material capable of coloring because of the donation of an electron to other materials or receiving a proton from a proton-donor such as an acid. These coloring agents which may be used in the present invention are not restricted to specific compounds and in general they include compounds which are usually colorless and have a partial skeleton of for instance lactone, lactam, sultone, spiro pyran, ester or amide, the partial skeleton being cleaved or splitted when coming it into contact with a color precursor. Examples thereof are, for instance, Crystal Violet lactone, benzoyl leuco Methylene Blue, Malachite Green lactone, rhodamine B lactam, 1,3,3-trimethyl-6'-ethyl-8'-butoxyindolinobenzospiro pyran.

As color precursors for these coloring agent, there may be mentioned, for instance, phenol compounds, organic acids or metal salts thereof, oxybenzoates and clay. In particular, the developer desirably used in the present invention includes phenols and organic acids hardly soluble in water having a melting point of from 50° to 250° C., particularly preferred range thereof being from 60° to 200° C.

Such phenol compounds include, for instance, 4,4'-isopropylidenediphenol (ie., bisphenol A); p-tert-butylphenol; 2,4-dinitrophenol; 3,4-dichlorophenol; 4,4'-methylenebis(2,6-di-tert-butylphenol); p-phenylphenol; 4,4-cyclohexylidenediphenol; 2,2'-methylenebis(4-tert-butylphenol); 2,2'-methylenebis(α-phenyl-p-cresol)thiodiphenol; 4,4'-thiobis(6-tert-butyl-m-cresol); sulfonyldiphenol; 1,1-bis(4-hydroxyphenol)-n-dodecane; 4,4-bis-(4-hydroxyphenyl)-1-pentanoic acid ethyl ester; p-tert-butylphenol-formalin condensate and p-phenylphenol-formalin.

Useful examples of the organic acids include 3-tert-butylsalicylic acid, 3,5-tert-butylsalicylic acid, 5-α-methylbenzylsalicylic acid, 3,5-di-α-methylbenzylsalicylic acid, 3-tert-octylsalicylic acid, 5-α,γ-dimethyl-α-phenyl-γ-phenylpropylsalicylic acid.

As the oxybenzoic acid ester, there may be mentioned, for example, ethyl p-oxybenzoate, butyl p-oxybenzoate, heptyl p-oxybenzoate and benzyl p-oxybenzoate.

The photohardenable microcapsule according to the present invention may contain a foaming agent for the purpose of effectively the collapsing the microcapsule to release the content thereof during heating.

In the present invention, nitroso type compounds, sulfohydrazido type compounds which are hydrazine derivatives of organo sulfonic acids, hydrazo compounds and azo compounds may be used as such foaming agent.

Examples of the nitroso type compounds include dinitrosopentamethylenetetramine, N,N'-dimethyl-N,N'-dinitrosoterephthalamide and trinitrosotrimethylenetriamine.

As the sulfohydrazide type compounds, there may be mentioned, p-toluenesulfohydrazide, benzenesulfohydrazide, p,p'-oxybis(benzenesulfohydrazide), benzene-1,3-disulfohydrazide, 3,3'-disulfohydrazidephenyl sulfone, toluene-2,4-disulfohydrazide, and p,p'-thiobis(benzenesulfohydrazide).

Examples of the hydrazo compounds include, for instance, hydrazodicarbamide, N,N'-dibenzoylhydrazine, β-acetylphenylhydrazine, biurea and 1,1-diphenylhydrazine.

As the azo compounds, there may be mentioned, for example, azobisisobutyronitrile, azodicarbonamide(azobisformamide), diazoaminobenzene and azocarboxylic acid diethyl ester (diethyl azodicarboxylate).

These organic foaming agents are all decomposed by heating and generate nitrogen gas. Although some compounds generate a small amount of carbon monooxide, carbon dioxide and water vapour in addition to nitrogen gas, at least 60% of the total gas generated is composed of nitrogen gas. The amount of gases generated, in general, falls within the range of from 100 to 300 ml/g.

The foaming agent is used in an amount of 0.1 to 20% by weight based on the capsule.

The thermal decomposition temperature of these organic foaming agents falls within the range of from about 80° to about 300° C. In this respect, an auxiliary agent for thermal decomposition may also be used in the present invention to lower the decomposition temperature of the organic foaming agent. Examples of effective auxiliary agent for thermal decomposition include, urea and derivatives thereof, zinc white (zinc oxide), lead carbonate, lead stearate and glycolic acid.

Preferred examples of the auxiliary agent for thermal decomposition are urea and the derivatives thereof such as ethanolamine urea, guanylurea and aminoguanidine carbonate. The auxiliary agent for thermal decomposition is preferably used in an amount of about 30 to 60% by weight based on the organic foaming agent.

It is believed that the decomposition temperature of chemically pure azodicarbonamide is 230° C. The decomposition temperature thereof can be lowered to about 120° C. by the addition of a variety of auxiliary agents for thermal decomposition.

The microcapsule as used in the present invention may be produced according to a conventional method well known in the art. As to the process for preparing microcapsules, reference is made to, for example, U.S. Pat. Nos. 2,800,457 and 2,800,458 in which a method utilizing coacervation of a material forming a hydrophilic wall is disclosed; U.S. Pat. No. 3,287,154, British Pat. No. 990,443 and Japanese Patent Publn. Nos. 38-19574, 42-446 and 42-711 in which microcapsules are prepared according to an interfacial polymerization technique; U.S. Pat. Nos. 3,418,250 and 3,660,304 which disclose a method for preparing microcapsules by separating out polymers; U.S. Pat. No. 3,796,669 which discloses a method utilizing a wall-forming material of isocyanate-polyol; U.S. Pat. No. 3,914,511 in which an isocyanate is used as the wall-forming material; U.S. Pat. Nos. 4,001,140, 4,087,376 and 4,089,802 which disclose a method using an urea-formaldehyde type or urea-formaldehyde-resorcinol type wall-forming material; U.S. Pat. No. 4,025,455 disclosing a method in which melamine-formaldehyde resin, hydroxypropyl cellulose or the like is utilized as a wall-forming material; Japanese Patent Publn. No. 36-9163 and Japanese Patent Appln. (OPI) No. 51-9079 disclosing a method in which microcapsules are produced, in situ, by polymerizing monomers; British Pat. Nos. 952,807 and 965,074 disclosing an electrolytic dispersion and cooling process; and U.S. Pat. No. 3,111,407 and British Pat. No. 930,422 disclosing a spray during method. The present invention is not restricted to the aforementioned methods. However, it is preferred that the microcapsule is produced by emulsifying core materials before forming a polymeric membrane as the wall thereof. The particle size of the microcapsule is preferably adjusted to 30μ to 0.01μ particularly to 10μ or less in view of handling properties.

In preparing microcapsules, a water soluble polymer and/or a surfactant may be used. The water soluble polymers used herein include anionic polymers, nonionic polymers and amphoteric polymers.

The anionic polymer may be a natural or a synthetic one having, for instance, groups such as $-COO^-$ and $-SO_3^-$. As the natural anionic polymer, there may be mentioned, for example, gum arabic, alginic acid; as the semisynthetic anionic polymer there may be mentioned, for instance, carboxymethyl cellulose, phthalated gelatin, sulfated starch, sulfated cellulose and lignin sulfonic acid; and the synthetic anionic polymers include maleic anhydride type copolymers (inclusive of those hydrolyzed), (meth)acrylic acid type polymers and copolymers, vinylbenzene sulfonic acid type polymers and copolymers, and carboxylated polyvinyl alcohols.

Examples of the amphoteric polymer include gelatin.

As the surfactant, there may be mentioned, for instance, nonionic surfactants such as polyoxyethylene alkyl ethers, polyoxyethylene alkyl phenyl ethers, polyoxyethylene fatty acid esters, sorbitan fatty acid esters, polyoxyethylene sorbitan fatty acid esters and glycerin fatty acid esters; anionic surfactants such as fatty acid salts, salts of alkylsulfates, alkylbenzenesulfonic acid salts, alkylnaphthalenesulfonic acid salts, salts of dialkyl sulfosuccinates, salts of alkyl phosphates, condensates of naphthalene sulfonic acid and formalin and salts of polyoxyethylene alkyl sulfates; cationic surfactants such as alkylamine salts, quaternary ammonium salts and polyoxyethylene alkylamine salts; and fluorine-containing surfactants. These surfactants or dispersion stabilizers may be used alone or in combination.

To emulsify or disperse the aforementioned ingredients, an apparatus for emulsifying is in general used. Preferred examples thereof are those capable of imparting a great sharing force to a liquid to be treated or those capable of applying ultrasonic energy thereto and, in particular, include a colloid mill, a homogenizer, a capillary-tube type emulsifying apparatus, a liquid siren, an electromagnetic striction type ultrasonic wave generator and an emulsifier provided with a Pollman tube whistle, which can provide an excellent result.

According to the present invention, the microcapsule thus prepared is then applied to the surface of a support. When applying the microcapsule to a support, a binder is in general used, which may be used alone or in combination. A hydrophilic binder is predominantly used and typical examples thereof are transparent or translucent hydrophilic binders which include natural materials such as proteins (for instance, gelatin, a derivative thereof or a derivative of cellulose), polysaccharides, for example, starch and gum arabic; and synthetic polymeric materials, for example, water soluble polyvinyl compounds such as polyvinyl pyrrolidone and acrylamide polymers. In addition to the foregoing synthetic polymers, a vinyl compound dispersed in the form of a latex is also known, which exhances in particular, dimensional stability of photographic materials.

A support which can be used in the present invention includes paper; paper laminated with a plastic film such as polyethylene, polypropylene or polystyrene film; aluminum (inclusive of alloys thereof) plate; a metal plate such as zinc, iron or copper plate; sheet or film of plastics such as cellulose acetate, cellulose propionate, cellulose butyrate, polyethylene terephthalate, polyethylene, polystyrene, polypropylene, polycarbonate and polyvinyl acetal; and paper or a plastic film laminated with a metallic foil or deposited with a metal layer such as those listed above. The support may be subjected to surface roughening treatment, surface hydrophilizing treatment or the like according to need.

Moreover, a protective agent such as starch can be used when applying microcapsules to a support. The different additives, binders, antioxidants, smudge preventing agents, surfactants which have conventionally been used in recording materials as well as methods for applying microcapsules to supports and methods for using them are well known in the art and are disclosed in, for instance, U.S. Pat. Nos. 2,711,375, 3,625,736, 3,836,383 and 3,846,331; British Patent No. 1,232,347; Japanese Patent Appln. (OPI) Nos. 50-44,012, 50-50,112, 50-127,718 and 50-30,615. Any one of them may be used in the present invention.

Silicone rubber used in the dry PS plate according to the present invention is one mainly comprising a linear organo polysiloxane having a molecular weight of from several thousands to several hundreds of thousands and repeating unit represented by the following formula:

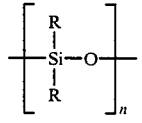

wherein R represents an alkyl or an alkenyl group having 1 to 10 carbon atoms or a phenyl groups. Among these polysiloxanes, preferred are those in which at least 60% of the substituents (R) are methyl group and the most preferred is dimethyl polysiloxane, all of the substituents (R) of which are methyl group.

Such a linear organopolysiloxane is crosslinked in a low degree to obtain silicone rubber. In order to sparsely crosslink the organopolysiloxane, a silicone crosslinking agent is used. The crosslinking agent includes a silane such as an acetoxysilane, a ketoximesilane, an alkoxysilane, an aminosilane, an amidosilane and an alkenyloxysilane used in the so-called room (low) temperature curling silicone rubber. Each type of these crosslinking agents is in general combined with a compound having a terminal hydroxyl group so as to form a deacetyl, a deoxime, a dealcohol, a deamine, a deamide, or a deketone (deacetone) type silicone rubber respectively.

Particularly preferred silicone crosslinking agents are those listed below:
(1) $R-Si(OR)_3$ (dealcohol type)
(2) $R-Si(OAc)_3$ (deacetyl type)
(3) $R-Si(ON=CR'_2)_3$ (deoxime type)
(4) $R-Si[OC(R')CH=CH_2]_3$ (deketone type)

In these formulas, R represents the same meaning as defined above, R' is an alkyl group such as methyl and ethyl groups and Ac stands for an acetyl group.

In general, a catalyst such as an organotin compound is also added to silicone rubber in a small amount.

From a viewpoint of the tone reproduction, the thickness of a silicone rubber layer is preferably as thin as possible, while the layer should be thick to some extent in the light of printing durability and background contamination. Therefore, the thickness thereof desirably falls within the range of approximately from 0.1 to $10\mu$ and usually from 0.5 to $3.0\mu$.

The dry PS plate of this invention is basically comprised of the foregoing construction and, according to need, it is also possible to dispose an adhesive layer between the microcapsule layer and the silicone rubber layer. Various kinds of such adhesive layers have been known and among others an aminosilane layer is effectively used in the present invention. The aminosilane herein referred to means a compound represented by the following general formula:

wherein R is an alkyl group having a substituted or unsubstituted amino group and having 1 to 15 carbon atoms, R' and R" represent an alkyl group having 1 to 15 carbon atoms or an aryl group, m is 1 or 2 and n is 0 or 1 provided that the sum of m and n equals 1 or 2.

Typical examples of such aminosilane includes 3-aminopropyltriethoxysilane, N-(2-aminoethyl)-3-aminopropyltrimethoxysilane, 3-aminopropyltrimethoxysilane, bis[3-(trimethoxysilyl)propyl]-amine, bis[3-(trimethoxysilyl)propyl]ethylenediamine, N-[3-(trimethoxysilyl)propyl]morpholine, trimethoxysilylpropyldiethylenetriamine, bis(2-hydroxy ethyl)aminopropyltriethoxysilane, 3-aminopropylmethyldiethoxysilane, (N,N-diethyl-3-amine)propyltrimethoxysilane, (N,N-dimethyl-3-amino)propyltrimethoxysilane, N-methylaminopropyltrimethoxysilane, N-phenylaminopropyltrimethoxysilane, 1-trimethoxysilyl-2-(p- or m-aminomethyl)-phenylethane and trimethoxysilylpropylarylamine.

Likewise, an organic titanate layer is preferably disposed between the aforementioned two layers for the purpose of ensuring the adhesion between them. The term "organic titanate"0 herein referred to generally means titanium type primers represented by the following formulas:
(i) $Ti(OR)_4$;
(ii) $Ti(OCOR')_{4-n}(OR)_n$; or
(iii)

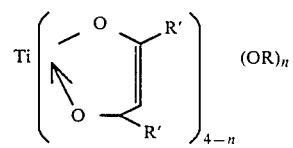

wherein R and R' may be the same or different and represent an alkyl or an alkenyl group having 1 to 10 carbon atoms, an aryl group or a cycloalkyl group having 3 to 10 carbon atoms and n is 0, 1, 2 or 3.

Typical examples thereof are tetraalkyltitanates such as tetraisopropoxytitanium, tetra-n-butoxytitanium, tetrastearoxytitanium, tetrakis-(2-ethylhexyl)titanate; titanium chelates such as dipropoxybis(actylacetonato)titanium, dibutoxy-bis(acetylacetonato)titanium, dibutoxy-bis(triethanolaminato)titanium, dihydroxybis(lactato)titanium, tetrakis(2-ethylhexanediolato)titanium; and titanium acylates such as tri-n-butoxytitanium monostearate and titanium tetrabenzoate or associates and polymers thereof.

The thickness of the adhesive layer is, in principle, equal to or more than that of the monomolecular layer and usually falls within the range of from 10 m$\mu$ to 2$\mu$. If the adhesive layer is too thick, the rate of the content of the microcapsule diffused into the silicone rubber layer becomes undesirably low.

Similarly, a good adhesion between the microcapsule layer and the silicone rubber layer is attained by incorporating a variety of materials as the adhesive component into the silicone rubber layer. Among others, an aminosilane or an organic titanate is preferred, which include, for instance, those listed above.

The aminosilane or organic titanate is added to the silicone rubber layer in an amount of from 0.05 to 10% by weight and particularly preferred amount thereof is from 0.1 to 5% by weight.

A combination of an aminosilane and an organic titanate can also be used in the present invention and further other adhesive components may be used in combination therewith.

A protective film may optionally be applied or coated onto the silicone rubber layer of the dry PS plate of the present invention.

The dry PS plate according to the present invention is first exposed to light through a transparency and then heated and/or pressed to collapse the microcapsule and to penetrate the content of the microcapsule present only in unexposed areas or image portions into the silicone rubber layer, which makes the silicone rubber layer ink-receptive. The resultant product per se can be used as a lithographic printing plate requiring no dampening water during printing at this stage. However, the product is incomplete in printing durability and therefore, it is preferred to use the same after hardening the photohardenable resin released from the microcapsule by further uniformly exposing the whole surface of the product to light or heat. The heating time and temperature can be controlled by suitably selecting the kind of capsule wall-forming materials, the thickness of the capsule wall, the kind of the photohardenable resins used or the like. These conditions are not critical and practically they are usually 70° to 250° C. and 0.1 second to 30 minutes respectively, preferably 90° to 220° C. and 1 second to 10 minutes. While the press operation can easily be carried out by, for instance, passing the plate between a pair of rolls which may optionally be heated during the press operation. Although the pressure applied may vary according to the purposes and is not restricted to a specific value, it is preferred that the microcapsules are collapsed by applying a pressure in the order of about 500 kg/cm$^2$ or more. However, it should be noted that the strength of the pressure applied can be adjusted by suitably selecting the diameter of the capsule, the thickness thereof, the kind of wall-forming materials or the like. Moreover, after the imagewise exposure of the dry PS plate according to the present invention, the plate may further be processed by, for example, subjecting it to uniform exposure to light and heat treatment for the purpose of initiating and/or promoting the polymerization of polymerizable monomers.

A light source used for imagewise exposure includes, for example, extra high voltage mercury lamps, carbon arc lamps, metal halide lamps, chemical lamps, fluorescent lamps and natural light (sun light).

Thus, the dry PS plate according to the present invention can be developed without using a liquid developer and the removal of the silicone rubber layer thereof is not needed to obtain a lithographic printing plate requiring no dampening water during printing, which makes it possible to eliminate the necessity of disposing a cover sheet. Therefore, the development of the dry PS plate of the present invention can be conducted simply and economically.

The present invention will hereunder be described in more detail with reference to the following Examples, however, it should be appreciated that the invention is not restricted to these specific Examples.

EXAMPLE 1

(1) A photohardenable microcapsule was prepared according to the following procedures.

There was dissolved 1.5 g of 2,2-dimethoxy-2-phenylacetophenone in 15 g of trimethylolpropane triacrylate and then 4 g of TAKENATE D110N (manufactured and sold by TAKEDA PHARMACEUTICALS Co. Ltd.) was dissolved therein to form an oil phase of an intended emulsion.

The resultant oil phase was dispersed and emulsified in 50 g of 2% aqueous solution of methyl cellulose. To the emulsion, there was added 7 g of 5% aqueous solution of diethylenetriamine while stirring at room temperature and the stirring was continued. After 30 minutes, the liquid was heated up to 40° C. and the stirring was continued for additional one and a half hours followed by cooling to form microcapsules.

(2) The microcapsule dispersion thus obtained was applied onto an art paper with a coating rod #12 in an amount of 5 g/m$^2$ after drying and heated to 100° C. for 2 minutes to dry.

(3) Then, the following silicon rubber composition was applied on the light-sensitive layer comprising the aforesaid microcapsule with a whirler in an amount of 1.5 g/m$^2$ after drying and dried at 110° C. for 2 minutes to obtain a silicone rubber layer.

| | Parts by weight |
|---|---|
| Dimethyl polysiloxane having hydroxyl groups at the both terminal ends (molecular weight (M.W.): about 600,000) | 100 |
| Methyl hydrogen polysiloxane having trimethylsilyl groups at the both terminal ends (M.W.: about 2,500) | 3.5 |
| 1-Methoxysilylpropyl-3,5-diallylisocyanurate | 3.3 |
| Dibutyltin dioctanoate | 3.3 |
| Iso Par G (manufactured and sold by EXXON CHEMICALS IND. INC.) | |

A polypropylene film of 12$\mu$ in thickness, one of the sides of which is matted, was laminated on the surface of the silicone rubber layer thus obtained to form a dry PS plate.

(4) The dry PS plate was superposed with a positive transparency with vacuumization and exposed to light utilizing FT 26V UDNS ULTRA-PLUS FLIP-TOP PLATE MAKER (manufactured and sold by nuARC IND. INC.). Thereafter, the laminated transparency was peeled off, and the resultant plate was heated to 160° C. for two minutes and then subjected to a uniform exposure to the light to obtain a lithographic printing plate requiring no dampening water during printing.

(5) The lithographic printing plate thus formed was then set on a printing machine (HEIDELBERG GTO) from which the water feeder had been removed. The printing was conducted using SUMI ink (TOYO KING ULTRA TUK AQUALESS G: manufactured and sold by TOYO INK Co.) to obtain printing matters having no background contamination.

EXAMPLE 2

(1) A photohardenable microcapsule was prepared according to the following procedures. There were dissolved 0.5 g of 4,4'-bis(diethylamino)benzophenone and 0.5 g of 2-mercapto-5-methylthio-1,3,4-thiadiazole in 25 g of trimethylolpropane triacrylate. While a solution of 2,2'-bis(o-chlorophenyl)-4,4',5,5'-tetraphenyl-biimidazole (1.5 g) in methylene chloride (5 ml) was separately prepared and mixed with the monomer solution prepared above to obtain an oil phase for an intended emulsion.

On the other hand, a mixed solution of 10% gum arabic aqueous solution (17.5 g), 12% isobutyrene-/maleic anhydride aqueous solution (18.8 g) and distilled water (26.8 g) was adjusted to pH 3.5 with sulfuric acid and 4.6 g of urea and 0.6 g of resorcin were added to the mixed solution, in which the aforesaid oil phase was dispersed to form an emulsion.

Then, 12.9 g of 36% formalin was added to the emulsion and heated to 60° C. while stirring. After one hour, 9 g of 5% ammonium sulfate aqueous solution was added thereto and stirred for one hour while maintaining the temperature at 60° C., followed by cooling. Thereafter, the pH thereof was adjusted to 7.0 with NaOH.

(2) The dispersion of microcapsules thus prepared was applied onto an art paper in an amount of 6 g/m² after drying with a coating rod #10 and dried by heating it to 100° C. for two minutes to form a light-sensitive layer of microcapsule.

(3) A silicone rubber layer was then formed on the light-sensitive layer according to Example 1 to form a dry PS plate.

(4) According to the procedures similar to those described in Example 1, the resultant PS plate was exposed to light, uniformly pressed with press rolls under a pressure of 300 kg/cm² and then subjected to a uniform exposure to obtain a lithographic printing plate requiring no dampening water during printing.

(5) When the lithographic plate thus prepared was applied to printing operation according to the manner as described in Example 1, printed matters having no background contamination were obtained.

What is claimed is:

1. A dry presensitized plate for use in making a lithographic printing plate requiring no dampening water during printing which comprises a support having provided thereon, in order, a photohardenable light-sensitive layer of microcapsules comprised of one polymerizable component selected from the group consisting of a photopolymerizable monomer and a light-sensitive resin and a silicone rubber layer.

2. The dry presensitized plate as set forth in claim 1 wherein wall-forming materials of the microcapsule are a member selected from the group consisting of polyurea, polyurethane, polyesters and mixtures thereof.

3. The dry presensitized plate as set forth in claim 1 wherein the microcapsule has a particle size of 0.01 to 30μ.

4. The dry presensitized plate as set forth in claim 3 wherein the particle size of the microcapsule is at least 0.5μ.

5. The dry presensitized plate as set forth in claim 1 wherein the photohardenable monomer is one having at least one vinyl or vinylidene group.

6. The dry presensitized plate as set forth in claim 5 wherein the vinyl or vinylidene group is a member selected from the group consisting of acryloyl, methacryloyl, allyl, unsaturated polyester, vinyloxy and acrylamido groups.

7. The dry presensitized plate as set forth in claim 5 wherein the photohardenable monomer has a plurality of vinyl or vinylidene groups in the molecule.

8. The dry presensitized plate as set forth in claim 1 wherein the microcapsule comprises a photopolymerization initiator capable of absorbing light at ultraviolet to visible region and initiating the polymerization of the monomer.

9. The dry presensitized plate as set forth in claim 1 wherein the microcapsule further comprises a foaming agent.

10. The dry presensitized plate as set forth in claim 9 wherein the foaming agent is a member selected from the group consisting of dinitrosopentamethylenetetramine, N,N'-dimethyl-N,N'-dinitrosoterephthalamide, trinitrosotrimethylenetriamine, sulfohydrazido type compounds which are hydrazine derivative of organic sulfonic acid, hydrazo compounds and azo compounds.

11. The dry presensitized plate as set forth in claim 10 wherein the microcapsule further comprises an auxiliary agent for thermal decomposition in an amount of about 30 to 60% by weight based on the foaming agent.

12. The dry presensitized plate as set forth in claim 1 wherein an adhesive layer having thickness of 10 mμ to 2μ is disposed between the microcapsule layer and the silicone rubber layer.

13. The dry presensitized plate as set forth in claim 12 wherein the adhesive layer is composed of an aminosilane layer or an organic titanate layer.

14. The dry presensitized plate as set forth in claim 1 wherein the silicone rubber layer comprises an adhesive component in an amount of from 0.05 to 10% by weight.

15. The dry presensitized plate as set forth in claim 14 wherein the amount of the adhesive component added to the silicone rubber layer is 0.1 to 5% by weight.

16. The dry presensitized plate as set forth in claim 14 wherein the adhesive component is a member selected from the group consisting of an aminosilane and an organic titanate.

17. The dry presensitized plate as set forth in claim 1 wherein a protective film is provided on the surface of the silicone rubber layer.

* * * * *